United States Patent
Kwak (10) Patent No.: US 6,288,953 B1
(45) Date of Patent: Sep. 11, 2001

(54) SEMICONDUCTOR MEMORY DEVICE HAVING SENSE AMPLIFIER CONTROL CIRCUIT RESPONDING TO AN ADDRESS TRANSITION DETECTION CIRCUIT

(75) Inventor: Pan-Suk Kwak, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/457,635

(22) Filed: Dec. 8, 1999

(30) Foreign Application Priority Data

Dec. 30, 1998 (KR) .................................................. 98-62261

(51) Int. Cl.$^7$ ........................................................ G11C 7/00
(52) U.S. Cl. ...................... 365/196; 365/189.05; 365/233
(58) Field of Search ...................... 365/233, 205, 365/207, 208, 233.5, 195, 196, 189.05

(56) References Cited

U.S. PATENT DOCUMENTS 5,566,112 * 10/1996 Lysinger ............................... 365/196
5,598,371 * 1/1997 Lee et al. ......................... 365/189.05

* cited by examiner

*Primary Examiner*—Vu A. Le
(74) *Attorney, Agent, or Firm*—Marger Johnson & McCollom, P.C.

(57) ABSTRACT

The disclosure is of a memory device using an address transition signal and having sense amplifiers, sense amplifier latch circuits, and a data output buffer, including: a circuit for generating a plurality of control signals for the sense amplifiers and latch circuits; and a circuit for inhibiting a generation of a control signal which causes a transfer from the sense amplifier to the data output buffer in the case of an abnormal address transition pulse signal that may be noisy or of a shortened duration. An invalid data transfer through the latch circuit can be prevented from a noise-included address transition signal.

8 Claims, 8 Drawing Sheets

SEMICONDUCTOR MEMORY DEVICE HAVING SENSE AMPLIFIER CONTROL CIRCUIT RESPONDING TO AN ADDRESS TRANSITION DETECTION CIRCUIT

FIELD OF THE INVENTION

The invention relates to a semiconductor memory device, more particularly to a sense amplifier control circuit, responsive to an output generated from an address transition detection circuit, for generating multiple signals to control sense amplifiers in a semiconductor memory device.

DESCRIPTION OF THE RELATED ART

Higher density memory devices usually employed address transition detection (ATD) circuits which generate signals active when external addresses are being changed. A signal made by the ATD circuit is used in controlling and adjusting operations of sense amplifiers, such as initiating a starting point of a sensing cycle and for establishing periods of the sensing, precharging, discharging, and equalizing cycles. It is important to optimize the generation of signals for controlling the sense amplifiers and to set activating conditions of the signals in a high density memory device, in order to accomplish an efficient read-out operation without failure.

Figure 1:
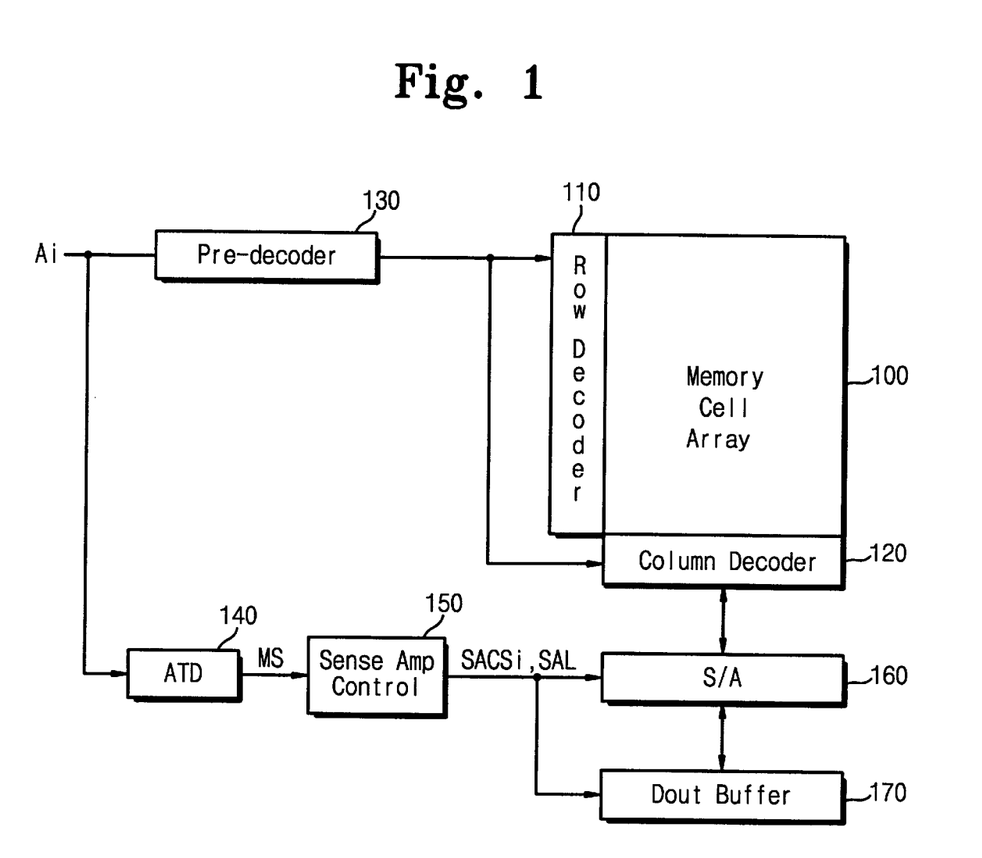
FIG. 1 is a block diagram of a semiconductor memory device having an address transition detection circuit and sense amplifier control circuit.

As shown in FIG. 1, a general semiconductor memory device (e.g., usually asynchronous semiconductor memory device) includes a memory cell array 100; a row decoder 110 for selecting wordlines of the memory cell array; a column decoder 120 for selecting bitlines of the memory cell array, an X/Y predecoder 130 for connecting external address lines Ai to the row and column decoders; an ATD circuit 140 for detecting a variation of the external address; a sense amplifier control circuit 150 for receiving a master signal MS from the ATD circuit and for generating sense amplifier control signals SACi and sense amplifier latch control signal SAL; a sense amplifier circuit 160 for detecting data stored in memory cells of the memory cell array is response to control signals SACSi and SAL supplied from the sense amplifier control circuit; and a data buffer 170 for transferring sensed data from the sense amplifier circuit to output terminals of the memory device.

Figure 2:
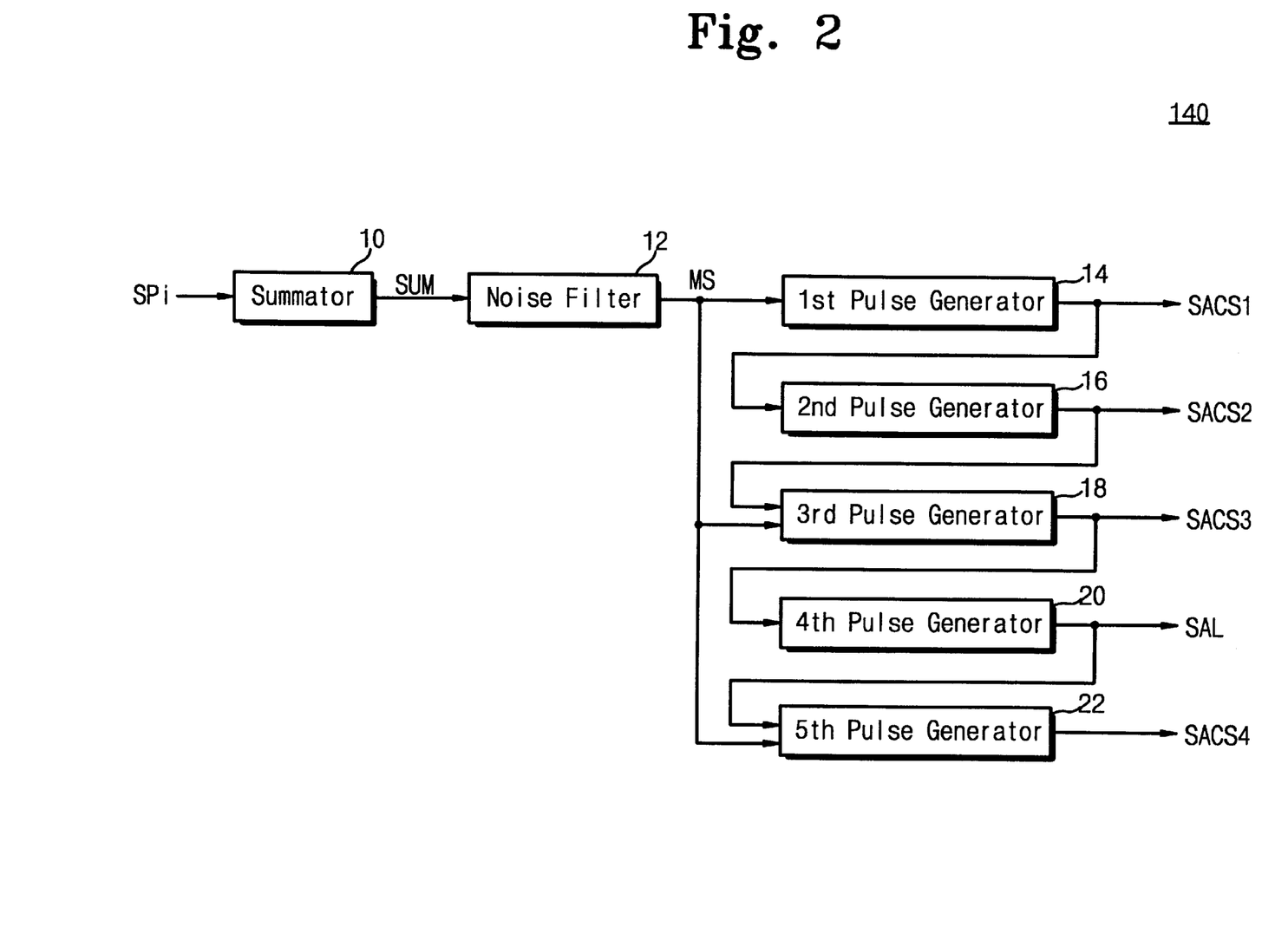
FIG. 2 shows a general construction of the address transition detection circuit and sense amplifier control circuit of FIG. 1.

The ATD circuit 140, with reference to FIG. 2, is formed of a summator 10, noise filter 12 and pulse generating circuits 14, 16, 18, 20, and 22 which respectively generate signals SACS1, SACS2, SACS3, SAL, and SACS4. Summator 10 receives short pulse signals SPi each of which is correspondingly dependent on a variation of the corresponding address signals, and then generates a summation signal SUM which reflects the time variation or variance of the external address signals Ai. The SUM signal is applied to the noise filter 12 which generates a master signal MS to be applied to pulse generation circuits 14, 18, and 22. Pulse generation circuit 14 makes a sense amplifier control signal SACS1 from master signal MS. Pulse generation circuit 16 receives the control signal SACS1, and then produces a sense amplifier control signal SACS2. Pulse generation circuit 18 receives the MS and SACS2 signals, and then generates SACS3. Pulse generation circuit 20 receives SACS3 signals, and then outputs sense amplifier latch control signal SAL. Pulse generation circuit 22 receives MS and SAL, and then generates SACS4.

Figure 3:
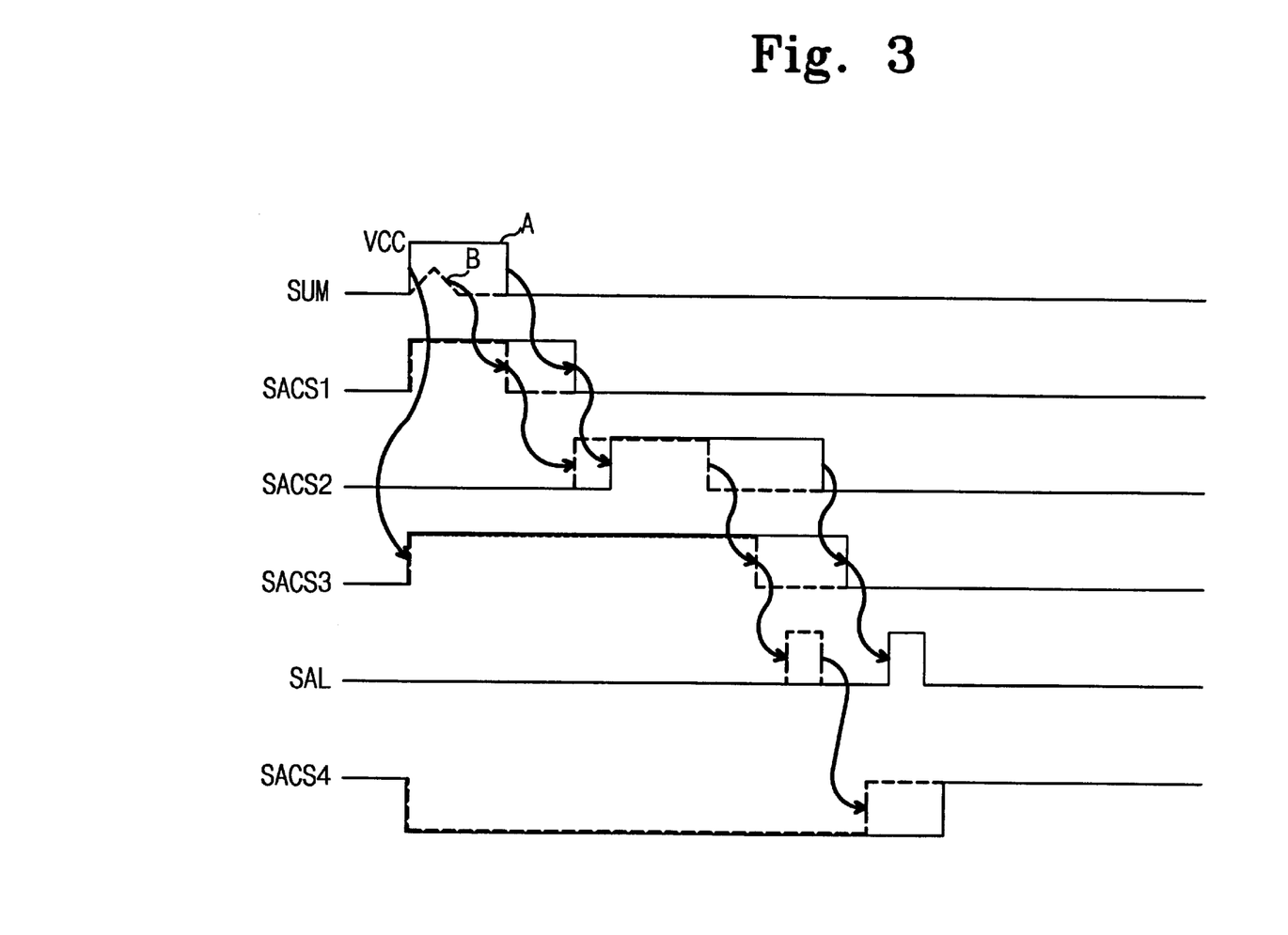
FIG. 3 is a timing diagram of FIG. 2.

In FIG. 3, which is a timing diagram corresponding with FIG. 2, if summation signal SUM is applied to noise filter 12 with a normal pulse shape A, sense amplifier control signals SACS1–SACS4 and latch control signal SAL are generated from their corresponding circuits shown in FIG. 2, enabling a successful sensing operation to be conducted in the sense amplifier circuits. However, it may occur that, if summation signal SUM has a defective (or distorted) pulse shape like B, due to an influence of noise, in which the pulse width is shorter than the normal one (A) and a lower peak voltage, SACS1 is generated with a shorter pulse width than its normal width, as shown by the broken line (this in FIG. 3 denotes an abnormal case for the defective SUM) even through SUM passes through noise filter 12. Thus, SACS2 is abnormally activated at an earlier time and with a shorter pulse width, and, subsequently the falling edge of SACS3 is forced to be faster than the normal one (as shown by the solid line). Thereby, latch control signal SAL is activated at a time earlier than that of the normal case, causing an activation period of SACS4 to be shorten thereby. Those earlier activations and shorter pulse widths for the control signals cannot provide an enough time in a complete sensing operation to the sense amplifier which needs a predetermined period for detecting a data level of a memory cell. As a result, it would be easy to induce reading failures from the abnormal fluctuation with the sense amplifier control signals and latch control signals.

SUMMARY OF THE INVENTION

The present invention is intended to solve the problems. And, it is an object of the invention, to provide a semiconductor memory device capable of securing a reliable sensing operation even in an existence of input noise.

It is an object of the invention to provide a semiconductor memory device for externally generating normal control signals for controlling a sense amplifier.

It is another object of the invention to provide a semiconductor memory device capable of internally generating sense amplifier control signals even when an input signal thereinto is supplied from an ATD circuit with noise.

In order to accomplish those objects, a memory of this invention includes a circuit for generating a plurality of control signals for sense amplifiers and sense amplifier latch circuits, and a circuit for inhibiting a generation of a control signal which causes a transfer from the sense amplifier to a data output buffer. An invalid data transfer through the latch circuit can be prevented from a noise-included address transition signal.

BRIEF DESCRIPTION OF THE DRAWINGS

For a better understanding of the invention, and to show how embodiments of the same may be carried into effect, reference will not be made, by way of example, to the accompanying diagrammatic drawings, in which.

In the figures, like reference numerals denotes like or corresponding parts.

DETAILED DESCRIPTION OF PREFERRED EMBODIMENTS

Hereinbelow, applicable embodiments of the invention will be described in detail, with the appended drawings.

Figure 4:
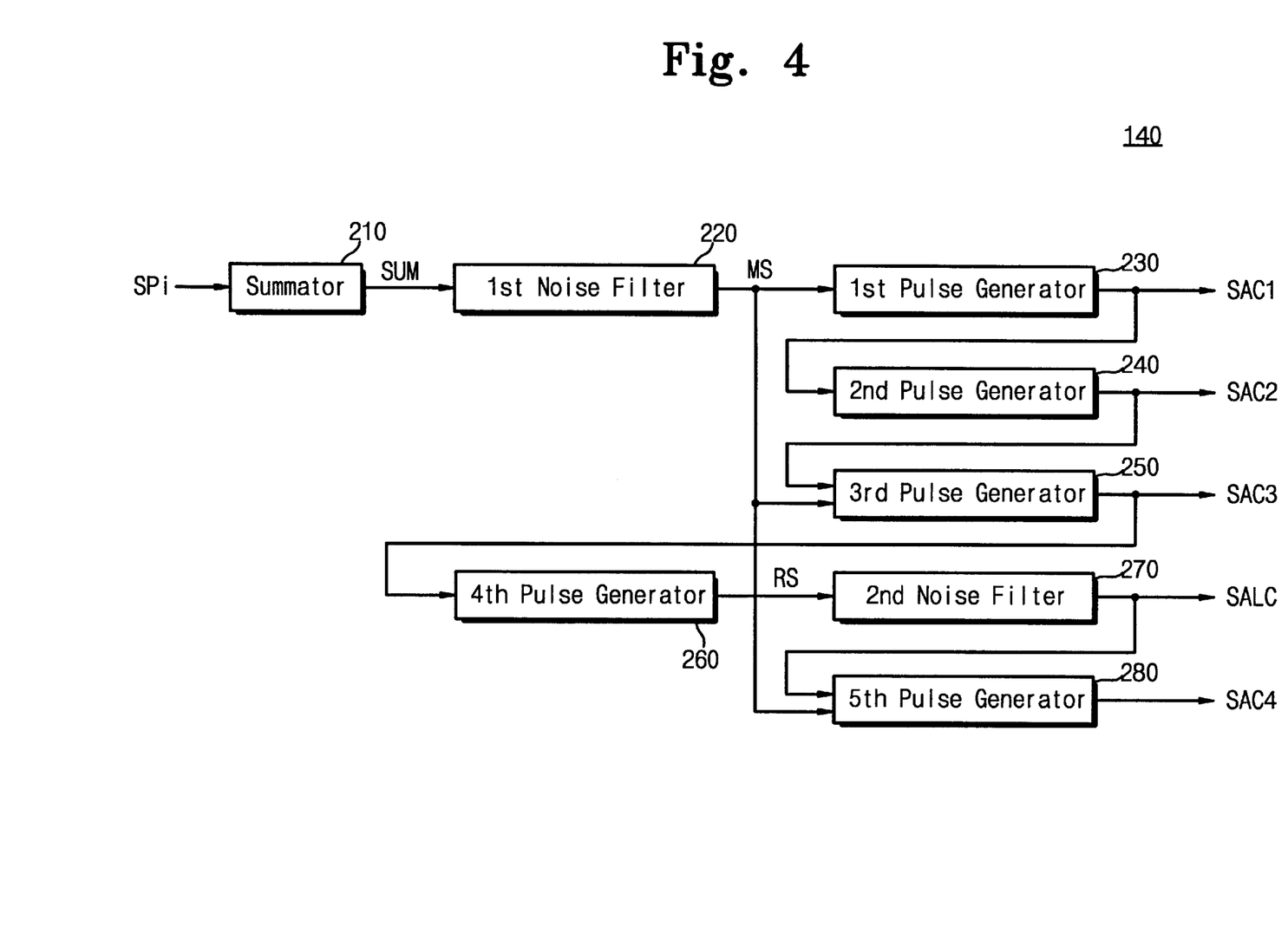
FIG. 4 shows an advanced construction of an address transition detection circuit and sense amplifier control circuit according to the invention.

FIG. 4 shows a construction of a proposed sense amplifier control circuit coupled to an ATD circuit, including a summator 210, a first noise filter 220, pulse generation circuits 230, 240, 250, 260, and 280, and a second noise filter 270. Summator 210 receives short pulse signals SPi each of which is responsive in a variation of each address signal Ai, and then generator summation signal SUM that reflects at least one of the variations of the external address signals Ai. The SUM signal is applied to the first noise filter 220 which generates a master signal MS to be applied to pulse generation circuits 230, 250, and 280. The first pulse generation circuit 230 produces a first sense amplifier control signal SAC1 by the master signal MS supplied from the first noise filter 220. The second pulse generation circuit 240 receives SAC1 supplied from the first pulse generation circuit 230, and then generates a second sense amplifier control signal SAC2. The third pulse generation circuit 250 receives the master signal MS from the first noise filter 220 and the control signal SAC2 supplied from the second pulse generation circuit 240, and then generates a third sense amplifier control signal SAC3. The fourth pulse generation circuit 260 receives SAC3 supplied from the third pulse generation circuit 250, and then generates a reference signal RS.

Second noise filter 270 receives the reference signal RS from the fourth pulse generation circuit 260, and generates a sense amplifier latch control signal SALC. Sense amplifier latch circuits (not shown) are each coupled to output terminals of sense amplifiers and store sensed data supplied from the sense amplifiers until newly sensed data appear at the output terminals of the sense amplifiers, as is conventional. The fifth pulse generation circuit 280 receives the master signal MS from the first noise filter 220 and the latch control signal SALC supplied from the second noise filter 270, and then generates a fifth sense amplifier control signal SAC4. The first to third sense amplifier control signals SAC1, SAC2, and SAC3 are used in discharging, precharging, and equalizing the sense amplifier, and the fourth sense amplifier control signal SAC4 determines an activation period of the sense amplifier (usually referred to as a sense amplifier enable signal). First noise filter 220 has the same configuration as the noise filter 12 shown in FIG. 2.

Figure 5:
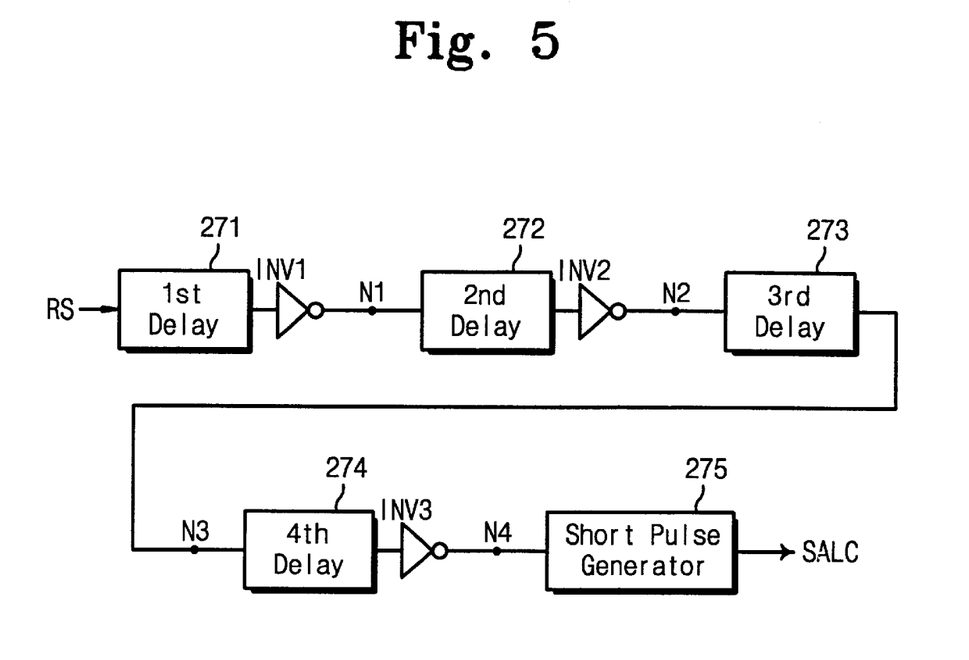
FIG. 5 shows an example of a second noise filter of FIG. 4.
Figure 6A:
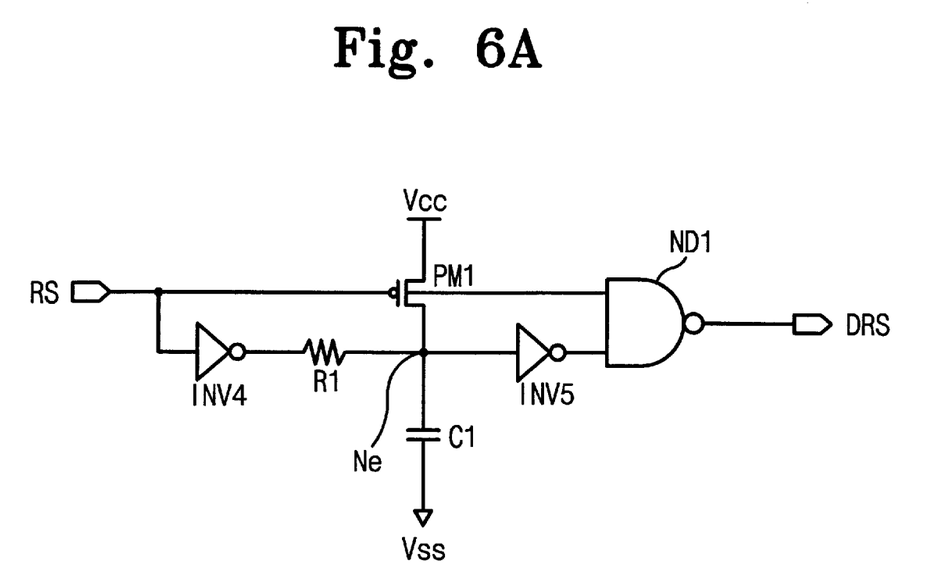
FIGS. 6A and 6B are circuit diagrams of a delay circuit and a short pulse generator shown in FIG. 5.
Figure 6B:
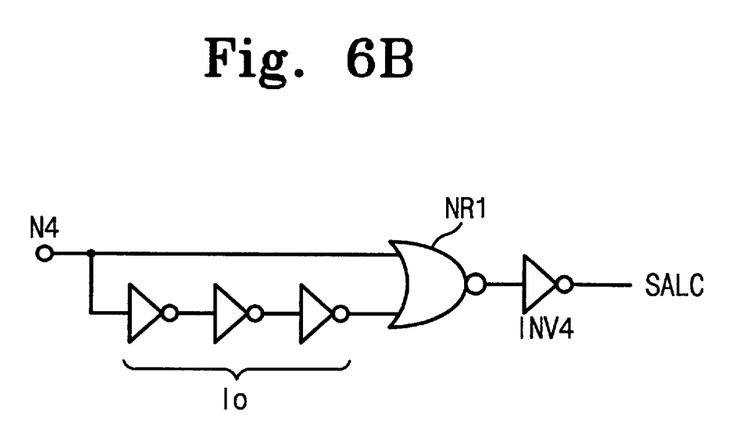

FIG. 5 shows an example of a second noise filter of FIG. 4. Referring to FIG. 5, the second noise filter 270 includes four delay circuit 271, 272, 273 and 274, three inverters INV1, INV2 and INV3, and a shorter pulse generator 275. Delay circuit 271, inverter INV1, delay circuit 272, inverter INV2, delay circuit 273, delay circuit 274, inverter INV3, and short pulse generator 275 are serially connected in this order. Delay circuit 271 receives reference signal RS supplied from the pulse generation circuit 206, and the short pulse generator 275 finally outputs latch control signal SALC. The circuit constructions of the delay circuits 271–274 are similar to each other. FIGS. 6A and 6B show practical examples of the delay circuit and short pulse generator, respectively, shown in FIG. 5.

Referring to FIG. 6A, the delay circuit has an input terminal RS coupled via a transistor to one input node of NAND gate ND1. The input terminal RS of the delay circuit is also connected to the other input node of NAND gate ND1 through inverter INV4, resistor R1, and inverter INV5. Between power source voltage Vcc and node Ne, disposed between resistor R1 and inverter INV5, a PMOS transistor P1 is connected with its source-drain channel. Node Nc is connected to substrate voltage Vss (or ground) through capacitor C1. The output of NAND gate ND1 provides a delayed RS signal RS. When an input signal, i.e., reference signal RS, is applied to the delay circuit, the RS input is relatively directly coupled to one input terminal of NAND gate ND1 while another path of the RS signal is driven into the other input terminal of NAND gate ND1 through inverter INV4, resistor R1, capacitor C1, and inverter INV5. Resistor R1 and capacitor C1 from a RC-delay parameter against reference signal RS, determining a pulse width of an output signal from NAND gate ND1.

A larger RC value by resistor R1 and capacitor C1, when an input signal of the delay circuit goes to a high logic level, causes a shorter pulse width of the output signal of NAND gate ND1 because an increased RC value makes a rising edge of the output signal from ND1 be moved to a later time while a falling edge of the output signal from ND1 is held at a falling edge of the input signal, i.e., reference signal RS. On the other hand, when an input signal going down to low logic level is taken into the delay circuit, a larger RC value induces a more elongated pulse width of the output signal from NAND gate ND1, in which the rising edge of the output signal from ND1 is held at the rising edge of the input signal while a falling edge of the output signal is moved to be later dependent on the RC value.

Referring to FIG. 6B, the short pulse generator 275 includes an odd number of series inverters Io and a NOR rate NR1. The number of inverters Io may determine a pulse width of the sense amplifier latch control signal SALC, a larger number of inverters Io causing a wider pulse width of SALC.

Figure 7:
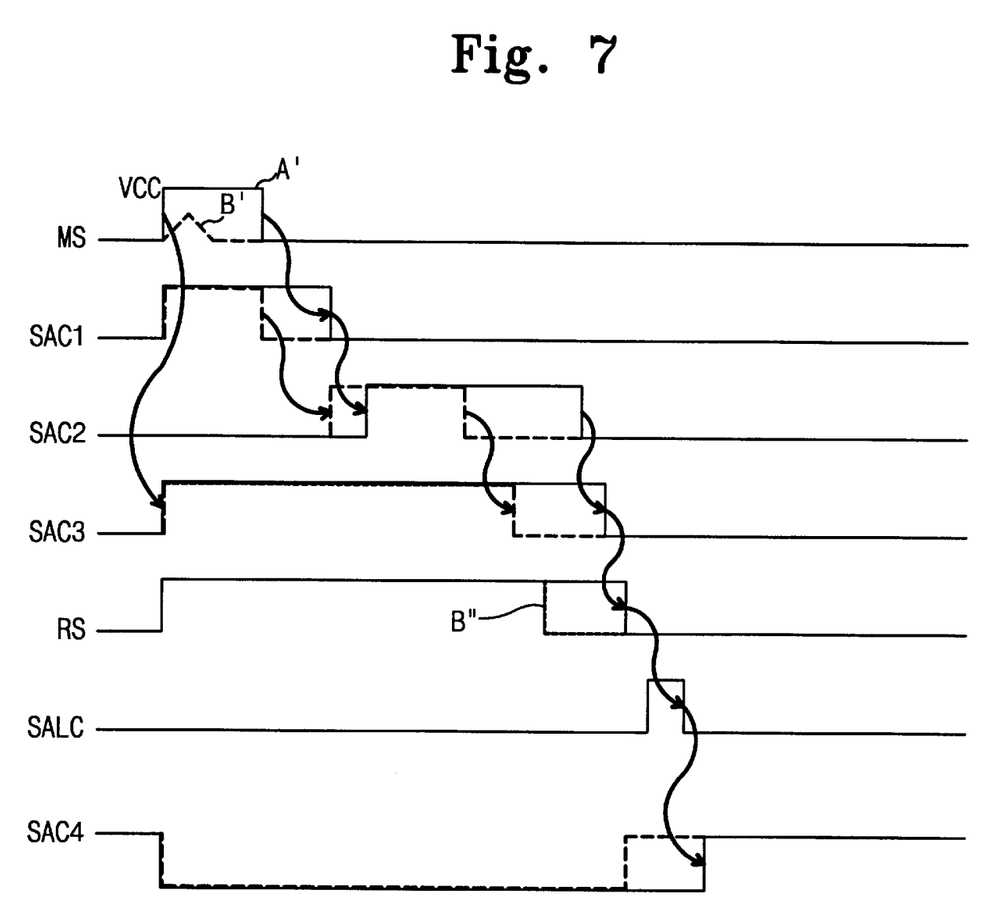
FIG. 7 is a timing diagram of FIG. 4, for generating signals for controlling sense amplifiers in the present device.

Now, an explanation of an operation for generating the control signals will be given in conjunction with the timing charts of FIGS. 7 and 8, in which pulse plots A'/A" and B'/B", with respect to a given master signal MS supplied from the first noise filter 220 which receives summation signal SUM from summator 210, A' and A" exemplifying normal pulse and B' and B" denoting abnormal pulses that contain noise. The pulse plots A' and A" in FIG. 7 will be understood to corresponding with the pulse plots B' and B" in FIG. 8.

First, when summation signal SUM including a noise is supplied from the ATD circuit into noise filter 220, master signal MS with a predetermined pulse width is generated from noise filter 220 still with the rest of the noise, and then applied to pulse generation circuits 230, 250, and 280. Pulse generation circuit 230 generates sense amplifier control signal SAC1 that is assigned to control discharging of a corresponding sense amplifier of the sense amplifier circuit. Pulse generation circuit 240 receives SAC1 and generates sense amplifier control signal SAC2 to precharge sensing nodes in the corresponding sense amplifier of the sense amplifier circuit. Pulse generation circuit 250 generates sense amplifier control signal SAC3, acting as an equalization signal for the corresponding sense amplifier of the sense amplifier circuit, which is initiated from an activation of master signal MS and falls down to low level in response to SAC2 supplied from pulse generation circuit 240. And then, pulse generation circuit 260 generates reference signal RS that is initiated by master signal MS and terminates in response to SAC3 supplied from pulse generation circuit 250. A pulse width of reference signal RS is designed to determine a pulse width of sense amplifier latch control signal SALC.

Noise filter 270 receives reference signal RS and generates sense amplifier latch control signal SALC with a pulse width shorter than that of reference signal RS. If the pulse width of reference signal RS is 50 ns (50 nanseconds), it may be appropriately operable to make a pulse width of sense amplifier latch control signal SALC be shortened to 10 ns, by reducing 40 ns from the 50 ns of reference signal RS, throughout the delaying and pulse shaping chain arranged in the noise filter 270.

Figure 8:
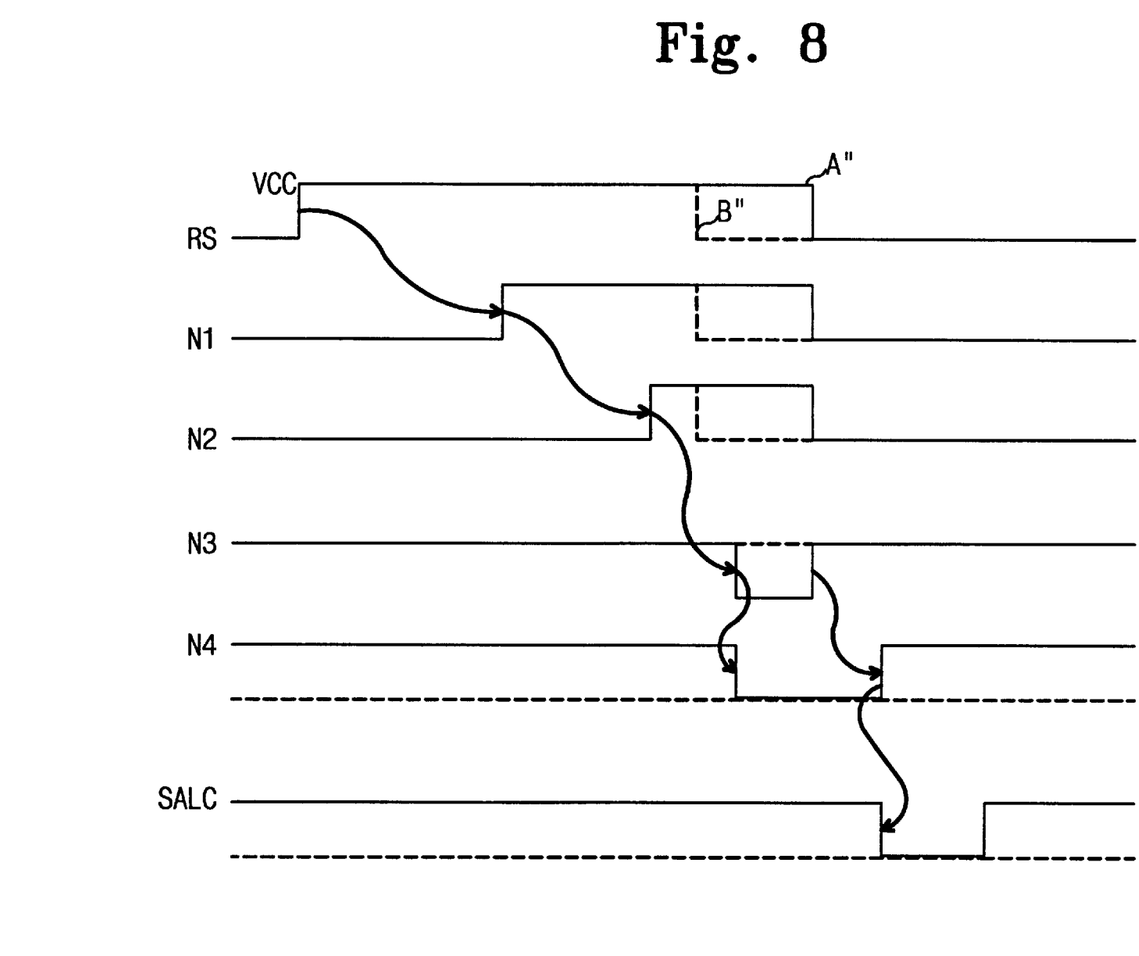
FIG. 8 is a timing diagram showing signals at nodes in the second noise filter of FIG. 5.

FIG. 8 shows a variation of pulses from a receipt with reference signal RS (pulse plot A") and an output with sense amplifier latch control signal SALC, in the second noise filter 270, delay circuit 271, receives reference signal RS and applies a signal shortened from reference signal RS to node N1 through inverter INV1. After reference signal RS goes to high level from low level, the signal at node N1 supplied from delay circuit 271 is initiated after a predetermined delay time set by delay circuit 271 from the rising edge of reference signal RS. The predetermined delay time set by delay circuit 271 is established by means of resistor R1 and capacitor C1 shown in FIG. 6A. Delay circuit 272 receives the shortened pulse signal from node N1, and then reforms the pulse signal at node N1 into a further shortened pulse signal. The output from delay circuit 272 is applied to nose N2 through inverter INV2, at which a rising edge is later than that of node N1 while a falling edge is the same as that of node N1. Delay circuit 273 receives the shortened pulse signal from node N2, and then reforms the pulse signal at node N2 into a further shortened pulse signal in which a starting edge (or a falling edge) is later than that of node N2 while a terminating edge (or a rising edge) is fixed into the same time with that of node N3. The output from delay circuit 273 appears at mode N3. Since the output of the third delay circuit 273 is not coupled to an inverter, the pulsed signal at node N3 is applied into the next delay circuit 274 with the low logic level as shown in FIG. 8.

Delay circuit 274 has the same construction with that of FIG. 6A. When an input pulse signal thereto from node N3 is a low logic level, an output pulse signal falls to low level synchronously responding to a falling edge of the input pulse signal and goes to high level after delayed by a predetermined time from a rising edge of the input pulse signal. Therefore, the pulse signal at node N4 to which the output of the fourth delay circuit 274 is applied through inverter INV3 is presented with a further lengthened pulse width from that of the input signal supplied from node N3. Finally, short pulse generator 275 makes a short pulse of latch control signal SALC that is initiated by a rising edge of the signal at node N4.

Returning briefly to FIG. 7, the fourth sense amplifier control signal SAC4 (or the sense amplifier enable signal), which has been active (low), having been initiated by the rising of master signal MS, is terminated responsive to a falling edge of the short pulse of latch control signal SALC generated from short pulse generator 275 of the second noise filter Pulse generator circuit 280 generates sense amplifier control signal SAC4, i.e., sense amplifier enable signal, which is set up by the rising edge of master signal MS and terminated in response to the falling edge of SALC.

On the other hand, in an abnormal case, when master signal MS still has a noise even though it passed through noise filter 220 (see the pulse plots B' and B"), pulse generation circuit 220 is forced to generate a more shortened SAC1. Then, consequently, SAC2 and SAC3 are activated at an earlier time or active for a more shortened period because of faster falling, resulting in a shortened RS as shown by B" in FIG. 8. Assuming that the pulse width of the output from the fourth pulse generation circuit, that corresponding to RS, in the normal case is 50 ns, the pulse width of RS (of B") may be 30 ns or less. With respect to the shortened RS, subsequent pulse widths are gradually shortened through delay circuits 271, 272, 273, and 274. Eventually, there is no occurrence of a pulse on the way to node N3 when the reducing amount for pulse width in noise filter 270 is designed to be about 40 ns. As a result, latch control signal SALC is not activated even when an output from the sense amplifier is applied to the sense amplifier latch circuit, so that a provably invalid sensed data bit in the condition of abnormal ATD signal would not be transferred to the data output buffer.

In the above-mentioned embodiment, an occurrence of the latch control signal is determined by a difference between the pulse width of the reference signal RS generated from the second noise filter and the the pulse width in the second noise filter, in which a noise-included ATD signal can be inhibited from an access to valid control signals for the sense amplifier and latch while passing a normal ATD signal which secures a valid operation for reading data a signed to memory cells designated valid address.

Making the latch control signal disabled may be accomplished by various circuit technology, e.g., gate logic circuit or other timing adjustment, and the architecture of the pulse generation and delay circuits can be properly modified by those skilled in the arts. And further, while this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. In a memory device having a sense amplifier and a data output buffer, with a sense circuit interposed therebetween, the improvement comprising:

an address transition signal for determining after a period of address transition time when data normally is ready at the output of the sense amplifier to be latched in the latch circuit;

a circuit for generating a plurality of control signals for the sense amplifiers and latch circuits; and a circuit operatively coupled with the plurality of control signals for inhibiting generation of a latch control signal that would case a transfer of data from the sense amplifier to the data output buffer via the latch upon detection of a noisy address transition signal.

2. A memory device using an address transition signal comprising:

a data output buffer;

a sense amplifier;

a latch circuit for receiving an output from the sense amplifier, the latch circuit being interposed between the sense amplifier and the data output buffer;

a circuit for generating a plurality of control signals for the sense amplifiers and latch circuits in response to the address transition signal; and a circuit for inhibiting an activation of the latch circuit when an abnormal signal is supplied thereto from the control signal generating circuit.

3. The device of claim 2, wherein one of the abnormality criteria is pulse shape.

4. The device of claim 2, wherein one of the abnormality criteria is pulse timing.

5. A memory device having a sense amplifier, the device comprising:
- a controller responsive to address signal variances for generating a latch control signal to the sense amplifier, the controller including;
- a summator for producing an address change variance signal;
- series coupled plural pulse generators responsive to the variance signal to generate a latch control signal; and
- plural filters operatively interposed the summator and a last one of said series coupled plural pulse generators, said filters shaping and timing a pulse signal that is propagated through the series coupled plural pulse generators to produce the latch control signal of waveform and timing characteristics that meet predefined memory device criteria.

6. The device of claim 5 in which the latch control signal is a pulse, wherein said criteria include pulse height, duration and timing relative to the address change variance signal.

7. The device of claim 6, wherein at least one of said plural filters interposes two of said series coupled plural pulse generators.

8. The device of claim 7, wherein said interposed one of said plurality filters includes plural pulse delay elements.

* * * * *

UNITED STATES PATENT AND TRADEMARK OFFICE
CERTIFICATE OF CORRECTION

PATENT NO.     : 6,288,953 B1
DATED          : September 11, 2001
INVENTOR(S)    : Kwak It is certified that error appears in the above-identified patent and that said Letters Patent is hereby corrected as shown below:

Column 1,
Line 37, "SACi" should read -- SACSi --.

Column 3,
Line 55, "shorter pulse" should read -- short pulse --.
Line 60, "circuit 206" should read -- circuit 260 --.

Column 4,
Line 6, "Node Nc" should read -- Node Ne --.
Line 9, "signal RS" should read -- signal DRS --.
Line 44, "normal pulse" should read --normal pulses --.
Line 46, "corresponding with" should read -- correspond with --.

Column 5,
Line 28, "nose N2" should read -- node N2 --.
Line 37, "mode N3" should read -- node N3 --.

Column 6,
Line 6, "that corresponding" should read -- that corresponds --.
Lines 26-27, "a signed to" should read -- assigned to --.
Line 52, "would case" should read -- would cause --.
Line 55, "transition signal" should read -- transition pulse signal --.
Line 62, "a circuit" should read -- a control signal generating --.
Line 64, "transition signal" should read -- transition pulse signal --.
Lines 66-67, "an abnormal signal is" should read -- a signal meeting defined criteria for abnormality is --.

UNITED STATES PATENT AND TRADEMARK OFFICE
CERTIFICATE OF CORRECTION

PATENT NO.    : 6,288,953 B1
DATED         : September 11, 2001
INVENTOR(S)   : Kwak It is certified that error appears in the above-identified patent and that said Letters Patent is hereby corrected as shown below:

<u>Column 8,</u>
Line 14, "plurality" should read -- plural --.

Signed and Sealed this

Twenty-second Day of October, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,288,953 B1
DATED : September 11, 2001
INVENTOR(S) : Kwak

It is certified that error appears in the above-identified patent and that said Letters Patent is hereby corrected as shown below:

Column 1,
Line 37, "SACi" should read -- SACSi --.

Column 3,
Line 55, "shorter pulse" should read -- short pulse --.
Line 60, "circuit 206" should read -- circuit 260 --.

Column 4,
Line 6, "Node Nc" should read -- Node Ne --.
Line 9, "signal RS" should read -- signal DRS --.
Line 44, "normal pulse" should read -- normal pulses --.
Line 46, "corresponding with" should read -- correspond with --.

Column 5,
Line 28, "nose N2" should read -- node N2 --.
Line 37, "mode N3" should read -- node N3 --.

Column 6,
Line 6, "that corresponding" should read -- that corresponds --.
Lines 26-27, "a signed to" should read -- assigned to --.
Line 52, "would case" should read -- would cause --.
Line 55, "transition signal" should read -- transition pulse signal --.
Line 62, "a circuit" should read -- a control signal generating --.
Line 64, "transition signal" should read -- transition pulse signal --.
Lines 66-67, "an abnormal signal is" should read -- a signal meeting defined criteria for abnormality is --.

UNITED STATES PATENT AND TRADEMARK OFFICE
CERTIFICATE OF CORRECTION

PATENT NO.    : 6,288,953 B1
DATED         : September 11, 2001
INVENTOR(S)   : Kwak It is certified that error appears in the above-identified patent and that said Letters Patent is hereby corrected as shown below:

<u>Column 8,</u>
Line 14, "plurality" should read -- plural --.

Signed and Sealed this

Twenty-ninth Day of October, 2002

Attest:

Attesting Officer

JAMES E. ROGAN
Director of the United States Patent and Trademark Office